(12) United States Patent
Liu (10) Patent No.: US 8,687,701 B2
(45) Date of Patent: Apr. 1, 2014

(54) METHOD AND DEVICE FOR ARITHMETIC CODE PACKAGE OUTPUTTING

(75) Inventor: Hao Liu, Guangdong (CN)

(73) Assignee: Shenzhen Coship Electronics Co., Ltd., Shenzhen, Guangdong (CN)

(*) Notice: Subject to any disclaimer, the term of this patent is extended or adjusted under 35 U.S.C. 154(b) by 364 days.

(21) Appl. No.: 13/142,408

(22) PCT Filed: Dec. 30, 2009

(86) PCT No.: PCT/CN2009/076251
§ 371 (c)(1),
(2), (4) Date: Jun. 27, 2011

(87) PCT Pub. No.: WO2010/075788
PCT Pub. Date: Jul. 8, 2010

(65) Prior Publication Data
US 2011/0268174 A1    Nov. 3, 2011

(30) Foreign Application Priority Data
Dec. 31, 2008    (CN) .......................... 2008 1 0187793

(51) Int. Cl.
| | |
|---|---|
| H04N 7/12 | (2006.01) |
| H04N 11/02 | (2006.01) |
| H04N 11/04 | (2006.01) |
| H03M 7/34 | (2006.01) |
| H03M 7/40 | (2006.01) |
| H03M 7/00 | (2006.01) |
| G06K 9/46 | (2006.01) |

(52) U.S. Cl.
USPC .......... 375/240.23; 341/51; 341/67; 341/107; 375/240.02; 382/247

(58) Field of Classification Search
None
See application file for complete search history.

(56) References Cited

U.S. PATENT DOCUMENTS

| | | | |
|---|---|---|---|
| 5,577,132 A | 11/1996 | Yokose et al. | |
| 7,535,387 B1 * | 5/2009 | Delva | ............................ 341/107 |

(Continued)

FOREIGN PATENT DOCUMENTS

| | | |
|---|---|---|
| CN | 1758756 A | 4/2006 |
| CN | 1964496 A | 5/2007 |

(Continued)

OTHER PUBLICATIONS

Marpe, Detlev. Schwarz, Heiko. Wiegand, Thomas. "Context-Based Adaptive Binary Arithmetic Coding in the H.264/AVC Video Compression Standard" IEEE Transactions of Circuits and Systems for Video Technology vol. 13, No. 7, Jul. 2003.*

(Continued)

Primary Examiner — Joseph Ustaris
Assistant Examiner — Rebecca Volentine
(74) Attorney, Agent, or Firm — Morris Manning & Martin LLP; Tim Tingkang Xia, Esq.

(57) ABSTRACT

A method and a device for arithmetic code package outputting. The method comprises: acquiring the 7-bit output string of the upper bits according to the CodLow value, i.e., the starting position of the probability space to be updated, and using the 7-bit ID string to identify the output characters with undetermined state in the 7-bit output string; acquiring the number of valid bits according to the CodRange value, i.e., the length of the probability space to be updated, wherein the number of valid bits indicates the number of valid bits of output characters in the 7-bit output string according to the CodLow value to be updated; extracting the valid output characters in the 7-bit output string according to the number of valid bits, identifying the output characters with undetermined state among the extracted valid output characters according to the 7-bit ID string; and processing the extracted valid output characters, acquiring and outputting the coding output bytes.

12 Claims, 7 Drawing Sheets

(56) References Cited

U.S. PATENT DOCUMENTS

| | | | |
|---|---|---|---|
| 7,714,753 B2* | 5/2010 | Lu | 341/107 |
| 7,777,654 B2* | 8/2010 | Chang | 341/107 |
| 8,046,395 B2* | 10/2011 | Suzuki | 708/205 |
| 2005/0270192 A1* | 12/2005 | Tsuru | 341/50 |
| 2008/0162911 A1* | 7/2008 | Vaithianathan | 712/300 |
| 2008/0175502 A1* | 7/2008 | Hu | 382/247 |
| 2009/0251342 A1* | 10/2009 | Bacri | 341/67 |

FOREIGN PATENT DOCUMENTS

| | | |
|---|---|---|
| CN | 101068360 A | 11/2007 |
| CN | 101500164 A | 8/2009 |
| FR | 2900004 A1 | 10/2007 |
| JP | 2007306370 A | 11/2007 |

OTHER PUBLICATIONS

Recommendation ITU-T H.264, Series H: Audiovisual and Multimedia Systems, infrastructure of audiovisual service—coding of moving video, Advanced video coding for generic audiovisual service, Mar. 2010, Telecommunication Standardization Sector of ITU, Geneva, Switzerland.

* cited by examiner

Acquiring an Updated CodRange Value According to
the CodRange Value

Counting a third number of bits valued "0" starting from the most significant
bit to the first bit valued "1" of the CodRange value to be updated.

Left shifting the CodRange value by the third number of bits and filling "0"
in the lower bits to acquire the updated CodRange value.

FIG. 5

Function of the Output Character Extracting Cache Module

The FIFO cache module receives the 7-bit output string transmitted by the CodLow analysis module, uses the 7-bit ID string to identify and store the states of the output characters in the 7-bit output string, and receives and stores the first number transmitted by the CodRange analysis module.

The output string conversion module reads the first number of valid bits and the 7-bit ID string stored in the FIFO cache module, extracts the valid output characters in the 7-bit output string stored in the FIFO cache module according to the first number of valid bits, identifies state of each extracted valid output character according to the 7-bit ID string, and output the extracted valid output characters to the output character FIFO cache module.

The output character FIFO cache module stores the extracted valid output characters transmitted by the output string conversion module.

FIG. 6

Function of the Undetermined State Identification and Packet Output Module

The output character judgment module reads one by one the extracted valid output characters from the output character FIFO cache module, and judges if the currently-read output character is in undetermined state. If the currently-read output character is in undetermined state, sends a counting instruction to the counting module and continue to judge if the next output character is in confirmed state. If the next output character is in confirmed state, regards the character opposite to this following output character as one in undetermined state. If the next output character is in undetermined state, continue to judge if the one following the next character is in confirmed state. If the one following the next character is in confirmed state, regards the character opposite to the one following the next output character as one in undetermined state. If the one following the next character is in undetermined state, continue to judge until the succeeding output character is in confirmed state, and regards the character opposite to the next output character, the one following the next output character or the succeeding output character as one in undetermined state. Sends the output character in undetermined state, and the character opposite to the next output character, the one following the next character or the succeeding character of this character in undetermined state to the output character caching module.

The counting module receives counting instructions, and implements integrated counting to the number of output characters in undetermined state.

The output character caching module receives the output characters in undetermined state transmitted by the output character judgment module, enters them into the current coding output byte, regards the character opposite to the next output character, the one following the next output character or the succeeding output character as one in undetermined state, according to the integrated count of the characters in undetermined state acquired from the counting module, and enters them into the current coding output byte.

FIG. 7

METHOD AND DEVICE FOR ARITHMETIC CODE PACKAGE OUTPUTTING

CROSS-REFERENCE TO RELATED PATENT APPLICATIONS

This application claims the priority to Chinese Patent Application No. 200810187793.7 filed on Dec. 31, 2008, and entitled "Method and Device for Arithmetic Code Package Outputting", the disclosure for which is hereby incorporated herein in its entirety by reference.

FIELD OF THE INVENTION

The present invention relates to an arithmetic coding technology concerning video processing, and in particular, to a method and device for arithmetic code package outputting.

BACKGROUND OF THE INVENTION

In the H.264 protocol, arithmetic coding is a common coding method for data compression in video processing, and its underlying rationale is as follows: processing the probability space in accordance with the current value of the binary data in the video coding circuit, acquiring the processed probability space for updating and renormalization, and generating the code stream according to the updated probability space. The generated code stream comprises coding output bytes, which are the final output from the encoder.

The probability space is usually indicated by the starting position (CodLow) and the length (CodRange) of the probability space. CodLow and CodRange are usually indicated in binary numbers. The values of CodRange and CodLow are updated in the H.264 protocol as follows:

The value of CodRange usually consists of nine bits, each being "0" or "1", the most significant bit being the 8th bit, the second most significant bit being the 7th bit; the same rule applies to the remaining bits, with the least significant bit as 0th bit. If the value of a bit in the CodRange value to be updated is 1 and all the upper bits preceding it are 0's, mark this bit as the mth bit. Then remove all the upper bits preceding the mth bit, put the mth bit and all the succeeding bits in turn into the starting position of the most significant bit, and assign zero to all the vacant lower bits. The CodRange value thus obtained is the updated CodRange value. For example, the value of a CodRange is 0001xxxxx, to update it, remove "0" from the 8th, 7th, and 6th bits, and use the succeeding "1xxxxx" as the 8th-3rd bits of the updated CodRange, and fill "0" into the vacant 2th-0th bits. Hence, the CodRange value is updated: 1xxxxx000, which will be used for the next renormalization.

The value of CodLow usually consists of ten bits, each being "0" or "1", the most significant bit being the 9th bit, the second most significant bit being the 8th bit; the same rule applies to the remaining bits, with the least significant bit as 0. The value of CodLow is updated according to the CodRange value and the CodLow value to be updated. Specifically, starting from the most significant bit of the CodRange value to be updated, if a certain bit is "1" and all the upper bits preceding it are 0's, all the significant bits preceding it are marked as n. If the upper n bits of CodLow to be updated are all 1's, i.e, its upper n bits all being "1 . . . 1", remove these n bits from CodLow, move all the succeeding bits to the positions of the removed upper bits in turn, and fill "0" in all the vacant least significant bit positions. If not all the n upper bits of CodLow are 1's, remove the n bits in CodLow, fill "0" in the most significant bit position, move the succeeding bits in turn to the positions starting from the second most significant bit, and fill "0" in the vacant least significant bit positions. The CodLow value thus obtained is the updated CodLow value. The updated CodLow value will be used for next renormalization.

While CodRange and CodLow are being updated, coding output bytes are output simultaneously. When the 8-bit output characters of a coding output byte are all filled up, this coding output byte will be output. The 8-bit output characters of the coding output byte are arranged in descending order of priority. Detailed below is a description of the conditions for the acquisition of the 8-bit output characters of coding output bytes.

Coding output bytes are acquired with reference to the values of CodRange and CodLow. The output characters comprised in output bytes are determined by two adjacent bits in the CodLow value, which are arranged in descending order of priority. Specifically, the 9th bit and the 8th bit determine one output character; so do combinations of the 8th bit and the 7th bit, the 7th bit and the 6th bit, and the 6th bit and the 5th bit. The same rule applies for other output characters. The number of valid output characters determined by a CodRange value to be updated equals to the number of the upper bits removed from the CodRange value when CodRange is updated. For example, if the number of the upper bits removed from a CodRange value during its update is 3, the number of valid output characters determined by the CodLow value to be updated will also be 3, comprising the ones determined by the 9th bit and the 8th bit, the 8th bit and the 7th bit, and the 7th bit and the 6th bit.

The rationale for the determination of output characters by two adjacent bits in the CodLow value comprises:

If the two adjacent bits are 00, the output character is 0;

if the two adjacent bits are 01, the output character is in undetermined state;

if the two adjacent bits are 10, the output character is 1; and if the two adjacent bits are 11, the output character is 1.

For two adjacent bits of a CodLow value to determine output characters, if either of the adjacent the 9th bit and the 8th bit is 0, each pair of two adjacent bits succeeding them determines the output characters, and it is necessary to set the value of the most significant bit of each pair succeeding the 9th bit and the 8th bit to "0"; if the 9th and 8th bits are both 11, it is unnecessary to change the values of each pair. For example, if the value of CodLow is 1010110001, the output character determined by the 9th and 8th bits is 1; one of the two bits is 0 (i.e, the 9th bit is 0), so when the 8th bit and the 7th bit (i.e 01) are to determine an output character, set the 8th bit to 0 which was originally 0; the output character determined by the original value (01) of the 8th bit and the 7th bit is in undetermined state; for the 7th bit and the 6th bit (i.e 10) to determine an output character, set the 7th bit to 0, it is 00 that determines the relevant output character, which is 0; for the 6th bit and the 5th bit (i.e 01) to determine an output character, set the 6th bit to 0 which was originally 0, the output character determined by the 6th bit and the 5th bit (original value being 01) is in undetermined state; for the 5th bit and the 4th bit (i.e 11) to determine an output character, set the 5th bit to 0, the output character determined by 01 is in undetermined state; the same rule applies for the other output characters.

After the output characters are acquired according to the values of CodRange and CodLow, judge them one by one; if an output character is in undetermined state, perform integrated counting on this character and continue to acquire the next output character; if an output character currently obtained is not in undetermined state, enter it into the current coding output byte; judge whether the value of the output character in undetermined state is 0, if yes, enter the output character currently obtained into the current coding output byte; if not, enter it into the current coding output byte, enter the number of the output characters in undetermined state and the output character opposite to the currently obtained output character into the current coding output byte.

To meet the conditions for renormalization and package outputting in the protocol, and implement renormalization and package outputting of arithmetic codes, the prior art employs the serial processing method for software implementation. This method requires multiple loops to complete one renormalization process, and will generate output characters and output related code streams during renormalization.

Figure 1:
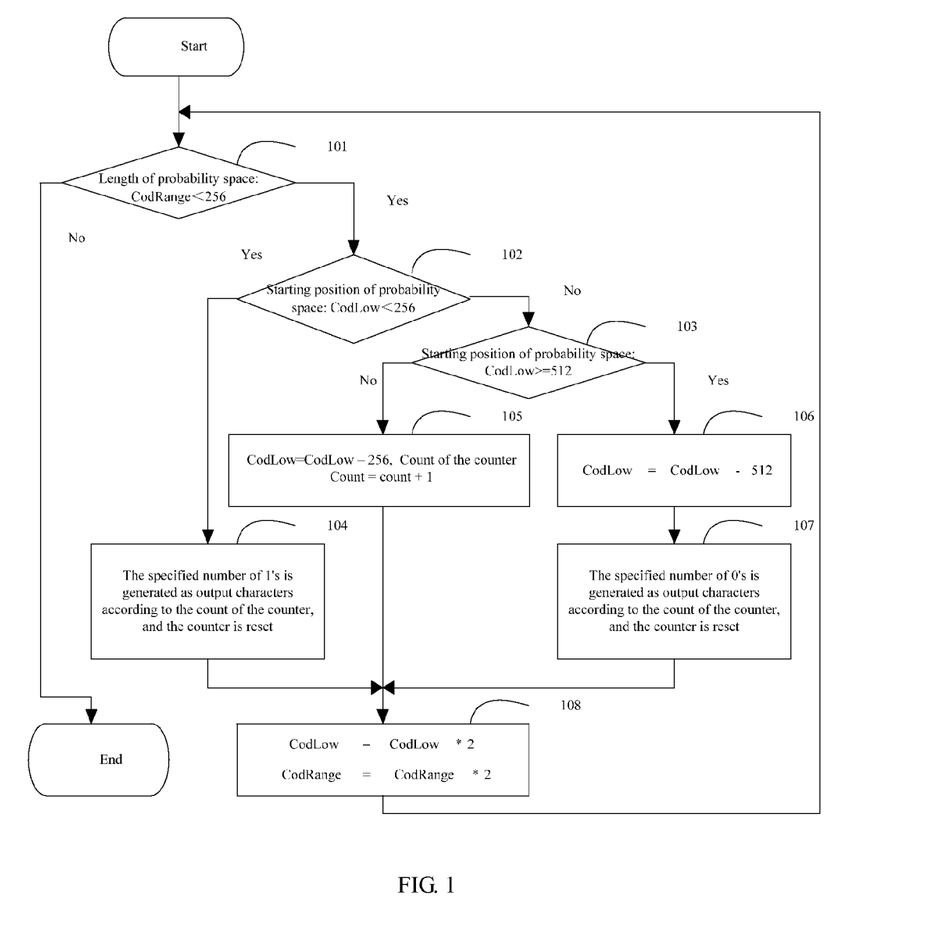
FIG. 1 is a flowchart of the renormalization and package outputting method for arithmetic code in the prior art.

In the H.264 protocol, the value ranges of CodRange and CodLow are [2, 255] and [0, 1023] respectively. FIG. 1 details the prior art renormalization and packaging procedures, wherein the reference probability space [0, 1023] is used as an example. The method comprises:

In Step 101, judge if CodRange is less than 256, i.e, if CodRange is less than ¼ of the total length of the reference probability space; if yes, perform step 102; otherwise, end the procedure.

Judge if CodRange, indicated in a binary code, is less than 256, that is, judge if the most significant bit of the 9-bit CodRange is 0;

In Step 102, judge if CodLow is less than 256, i.e, if the current probability space is located in the lower half of the reference probability space; if yes, perform step 104; otherwise, perform step 103;

Judge if CodLow, indicated in a binary code, is less than 256, that is, judge if the most significant bit and the second most significant bit of the 10-bit CodLow are both 0's;

In Step 103, judge if CodLow is equal to or greater than 512, i.e, if the current probability space is located in the upper half of the reference probability space; if yes, perform step 106; otherwise, perform step 105;

In Step 104, generate one "0" as an output character, generate as many 1's as the count displayed on the counter (i.e, as many 1's as the count) for output characters, reset the counter and perform step 108;

In Step 105, deduct 256 from the CodLow value, i.e, move the position of the current probability space to the lower half by ¼ of the total length of the reference probability space, add 1 to the count of the counter, and perform step 108;

In Step 106-step 107, deduct 512 from the CodLow value, i.e, move the position of the current probability space to the lower half by ½ of the total length of the reference probability space, generate one "1" as an output character and as many 0's as the count displayed on the counter (i.e, as many 0's as the count) for output characters; afterwards, reset the counter and perform step 108; and In Step 108, respectively multiply the CodLow value and the CodRange value by 2, i.e, double the length of the current probability space, and return to step 101.

In the foregoing procedure, step 101 to step 108 constitute a loop.

According to the procedure, the probability space is updated by updating the values of CodLow and CodRange; and output characters are acquired during renormalization and update of the probability space. However, when each loop comes to step 108, the length of the probability space is doubled; return to step 101 for judgment; the current renormalization procedure ends only when CodRange is equal to or greater than 256. If the minimum value of CodRange is 2 in step 101, seven loops are needed to complete the whole renormalization procedure, which will consume a considerable amount of unit time.

Evidently, the renormalization is inefficient, which in turn slows probability space updating and video processing, and reduces the efficiency of arithmetic coding. Furthermore, CodLow and CodRange updating, and output character generation are mixed, making it difficult to increase the processing efficiency.

Therefore, a heretofore unaddressed need exists in the art to address the aforementioned deficiencies and inadequacies.

SUMMARY OF THE INVENTION

In one aspect, the present invention provides a method of arithmetic code package outputting. The method can simplify package outputting and speed up coding.

In another aspect, the present invention provides a device for arithmetic code package outputting. The device can simplify package outputting and speed up coding.

In one embodiment, a method of arithmetic code package outputting is provided. The method comprises:

acquiring the 7-bit output string of the upper bits according to the CodLow value, i.e the starting position of the probability space to be updated, and using a 7-bit ID string to identify the output characters in undetermined state in the 7-bit output string; acquiring the number of valid bits according to the CodRange value, i.e length of the probability space to be updated;

extracting the valid output characters according to the number of valid bits in the 7-bit output string, and identifying the output characters in undetermined state in the obtained output characters in accordance with the 7-bit ID string; and processing the extracted valid output characters, acquiring and outputting the coding output bytes.

A device for arithmetic code package outputting is provided in another embodiment of the present invention. The device comprises a CodLow analysis module, a CodRange analysis module, an output character extracting cache module, and an undetermined state identification and packet output module.

The CodLow analysis module, adapted to acquire the 7-bit output string of the upper bits according to the CodLow value to be updated, use a 7-bit ID string to identify the output characters in undetermined state in the 7-bit output string, and transfer the 7-bit output string to the output character extracting cache module.

The CodRange analysis module, adapted to acquire the number of valid bits according to CodRange to be updated, and transfer the number of valid bits to the output character extracting cache module.

The output character extracting cache module, adapted to extract the valid output characters from the 7-bit output string, store the extracted valid output characters, and identify those in undetermined state among the extracted output characters according to the 7-bit ID string.

The undetermined state identification and packet output module, adapted to read output characters from the output character extracting cache module, process the valid output characters, acquire the coding output bytes, and output the coding output bytes.

As shown in the preceding embodiments of the present invention, the number of valid bits is acquired according to the CodRange value to be updated; the 7-bit output string is acquired according to the CodLow value to be updated; a 7-bit ID string is used to identify the output characters in undetermined state in the 7-bit output string; the coding output bytes are generated according to the number of valid bits, the 7-bit output string and the 7-bit ID string. Embodiments of the present invention separate the acquisition of coding output bytes from the update of CodRange and CodLow values to complete a package outputting process involving any number of loops within one clock cycle, thereby simplifying implementation and increasing the coding speed.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment, and wherein.

DETAILED DESCRIPTION OF THE INVENTION

To further clarify the object, technical scheme, and advantages of the present invention, the following section offers a detailed description of the present invention based on the embodiments and accompanying drawings.

A method of hardware circuit implementation through parallel processing is adopted in an embodiment of the present invention, with the CodRange value and the CodLow value updated simultaneously; when CodRange is updated, the number of valid bits is acquired; when CodLow is updated, the 7-bit output string and the 7-bit ID string are acquired, with the 7-bit ID string identifying the output characters in undetermined state in the 7-bit output string; and according to the number of valid bits, the 7-bit output string and the 7-bit ID string, output characters are thereby generated. The present invention independently updates the CodRange value and the CodLow value in parallel, and separates updating from package outputting to complete the renormalization process involving any number of loops in the prior art within one clock cycle; in addition, package outputting based on renormalization can be completed in another clock cycle, that is, renormalization and package outputting can be completed within two clock cycles, which in turn simplifies implementation and speeds up coding.

In addition to hardware circuit implementation through parallel processing in an embodiment of the present invention, the prior art method of serial implementation can be adopted to update the CodRange value and the CodLow value; while package outputting is still adopted to generate output characters according to the number of valid bits, 7-bit output string and the 7-bit ID string as stated in an embodiment of the present invention; and update of the CodRange value and the CodLow value can be implemented through all the steps except steps 104, 105 and 107 as shown in FIG. 1. Please refer to "Background of the Invention" for more details.

Figure 2A:
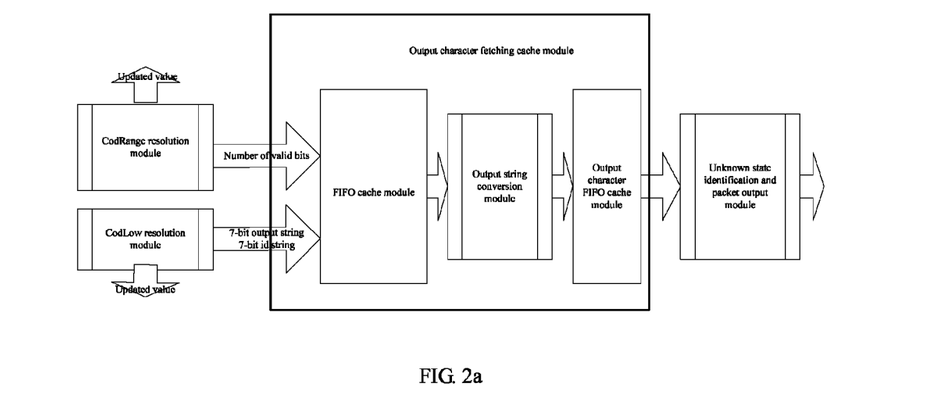
FIG. 2a shows a structure of the device for arithmetic code package outputting according to one embodiment of the present invention.

FIG. 2a shows a structure of the device for renormalization and package outputting of arithmetic code as embodied in the present invention. The device comprises a CodRange analysis module, a CodLow analysis module, an output character extracting cache module and an undetermined state identification and packet output module.

The CodLow analysis module, adapted to acquire the 7-bit output string of the upper bits and the 7-bit ID string according to the CodLow value to be updated, and transfer to the output character extracting cache module, with the 7-bit ID string identifying the output characters in undetermined state in the 7-bit output string; specifically, the CodLow analysis module acquires the 7-bit output string of the upper bits according to the CodLow value to be updated, uses the 7-bit ID string to identify the output characters in undetermined state in the 7-bit output string, and transfers the 7-bit output string to the output character extracting cache module.

As for the output string, its seven bits are acquired through advance calculation. In this embodiment, the 7-bit ID string is added to determine the output characters in undetermined state in the output string and the ID string identifies the output characters in undetermined state in the 7-bit output string;

The CodRange analysis module, adapted to acquire the number of valid bits according to CodRange to be updated, and transfer the number of valid bits to the output character extracting cache module. The number of valid bits indicates the number of valid bits of output characters in the 7-bit output string.

The output character extracting cache module, adapted to extract valid output characters from the 7-bit output string according to the number of valid bits, store the extracted output characters, and identify the output characters in undetermined state among the extracted valid output characters according to the 7-bit ID string.

The undetermined state identification and packet output module, adapted to read output characters from the output character extracting cache module, process the valid output characters, acquire the coding output bytes, and output the coding output bytes.

Figure 4:
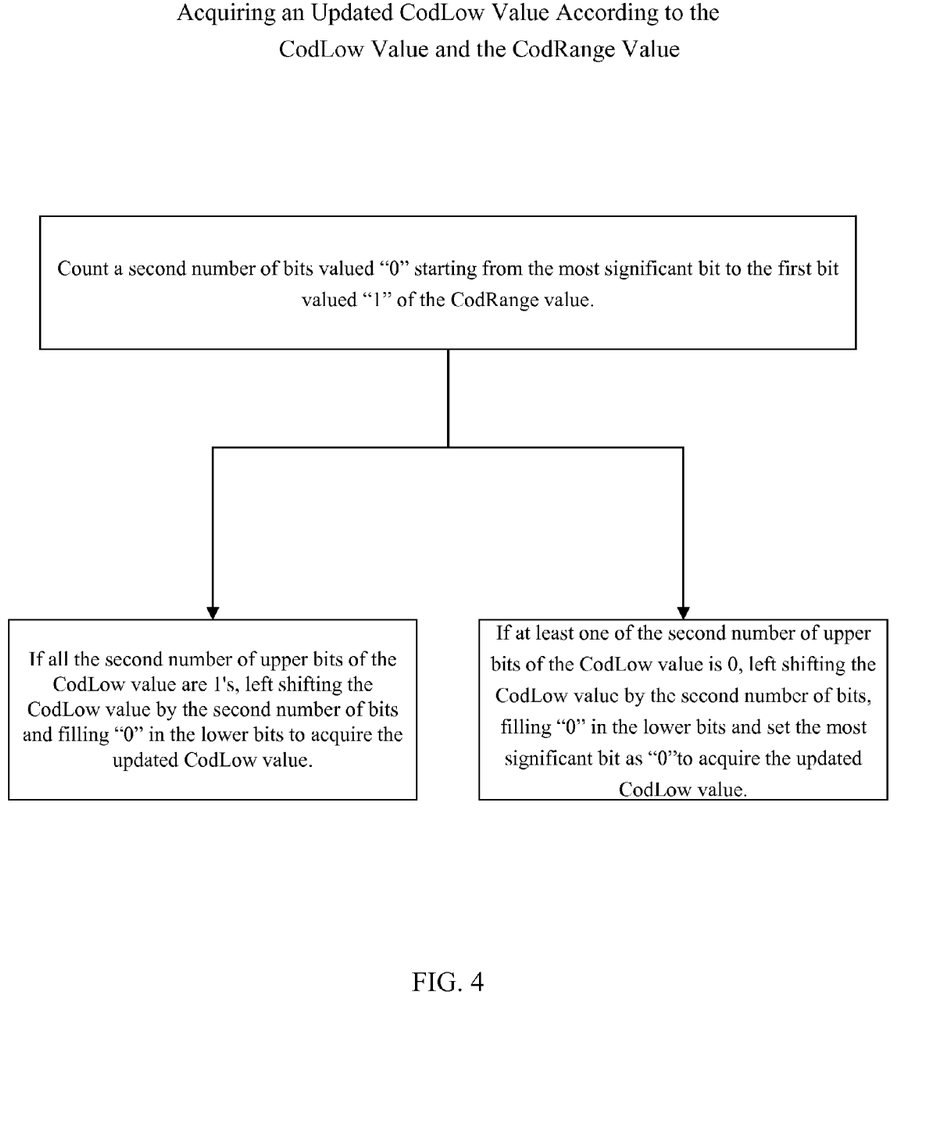
FIG. 4 shows a flowchart the method of acquiring an updated CodLow value according to one embodiment of the present invention.

Optionally, the CodLow analysis module may also be adapted to acquire the updated CodLow value through a hardware circuit implementation method according to the CodLow value and the CodRange value to be updated, as shown in FIG. 4. Specifically, the method of hardware circuit implementation may be combining the value of each bit of CodRange to be updated into a logic judgment circuit, directly mapping the number of upper the 0th bit's of CodRange to be n, and acquiring the updated CodLow value by left shifting CodLow according to the n. However, the process is more than this.

The value of CodLow usually consists of ten bits, each being "0" or "1", the most significant bit being the 9th bit, the second most significant bit being the 8th bit; the same rule applies to the remaining bits, with the least significant bit being the 0th bit. The value of CodLow is updated according to the CodRange value and CodLow value to be updated. Specifically, starting from the most significant bit of the CodRange value to be updated, if a certain bit is "1" and all the bits preceding it are 0's, the number of all the significant bits preceding it is marked as n; if the n upper bits of CodLow to be updated are all 1's, i.e, its n upper bits being "1 . . . 1", remove these n bits from CodLow, move all the succeeding bits to the positions of the removed upper bits in turn, and fill "0" in all the vacant least significant bit positions; If not all the n upper bits of CodLow are 1's, remove the n bits in CodLow, fill "0" in the most significant bit position, move the succeeding bits in turn to the positions starting from the second most significant bit, and fill "0" in the vacant least significant bit positions. The CodLow value thus extracted is the updated CodLow value. The updated CodLow value will be used for next renormalization.

The hardware circuit implementation method can satisfy various conditions for the update of the CodLow value through hardware circuit setting, so that update of the CodLow value can be completed within one clock cycle.

The output characters comprised in output bytes are determined by two adjacent bits in the CodLow value, with the output characters arranged in descending order of priority. Specifically, the 9th bit and the 8th bit determine one output character; so do the 8th bit and the 7th bit, the 7th bit and the 6th bit, the 6th bit and the 5th bit; the same rule applies for other output characters. To acquire output characters through software implementation based on serial processing, up to seven loops are required for one renormalization process, that is, one renormalization process can output a maximum of seven characters. Therefore, in an embodiment of the present invention, the CodLow analysis module acquires the 7-bit output string of the upper bits according to the CodLow value to be updated while it updates the CodLow value. The 7-bit output string involves seven output characters acquired from each pair of two adjacent bits in the CodLow value, comprising the output characters determined by combinations of the 9th bit and the 8th bit, the 8th bit and the 7th bit, the 7th bit and the 6th bit, the 6th bit and the 5th bit, the 5th bit and the 4th bit, the 4th bit and the 3rd bit, and the 3rd bit and the 2nd bit.

The rationale for the determination of output characters by two adjacent bits in the CodLow value comprises:

If the two adjacent bits are 00, the output character is 0;
if the two adjacent bits are 01, the output character is in undetermined state;
if the two adjacent bits are 10, the output character is 1; and
if the two adjacent bits are 11, the output character is 1.

For two adjacent bits of a CodLow value to determine output characters, if either of the adjacent the 9th bit and the 8th bit is 0, each pair of two adjacent bits succeeding them determines the output characters, and it is necessary to set the value of the most significant bit of each pair of two adjacent bits succeeding them to 0; if the 9th and 8th bits are both 1, it is unnecessary to change the values of each pair of two adjacent bits succeeding the 9th bit and the 8th bit. For example, if the value of CodLow is 1010110001, the output character determined by the 9th and 8th bits is 1; one of the two bits is 0 (i.e, the 9th bit is 0), so when the 8th bit and the 7th bit (i.e 01) are to determine an output character, set the 8th bit to 0 which was originally 0; the output character determined by the original value (01) of the 8th bit and the 7th bit is in undetermined state; for the 7th bit and the 6th bit (i.e 10) to determine an output character, set the 7th bit to 0, it is 00 that determines the relevant output character, which is 0; for the 6th bit and the 5th bit (i.e 01) to determine an output character, set the 6th bit to 0 which was originally 0, the output character determined by the 6th bit and the 5th bit (original value being 01) is in undetermined state; for the 5th bit and the 4th bit (i.e 11) to determine an output character, set the 5th bit to 0, the output character determined by 01 is in undetermined state; the same rule applies for the other output characters.

While acquiring the 7-bit output string, the CodLow analysis module also records the output characters in undetermined state in the 7-bit output string, which is indicated by an ID string of seven bits, or called 7-bit ID string.

Figure 5:
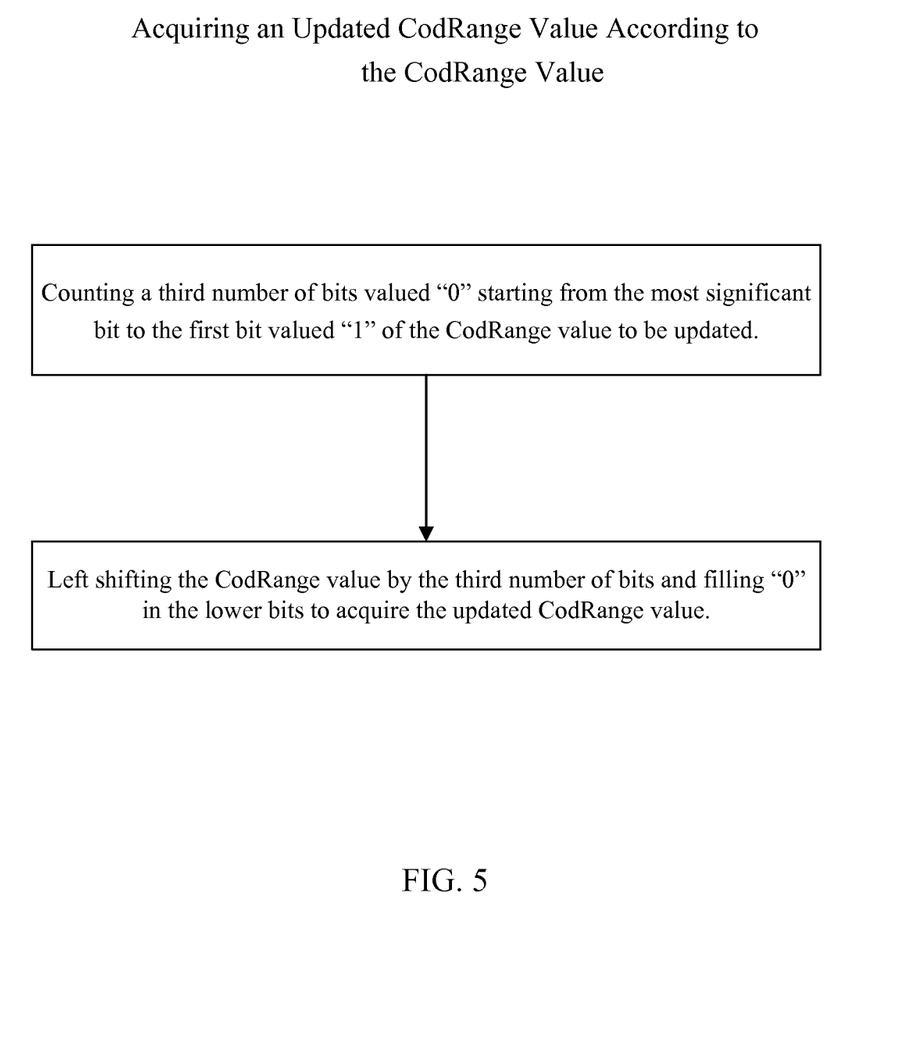
FIG. 5 shows a flowchart the method of acquiring an updated CodRange value according to one embodiment of the present invention.

Optionally, the CodRange resolution mode can be further adapted to acquire the updated CodRange value through hardware circuit implementation according to the CodRange value to be updated, as shown in FIG. 5.

The value of CodRange usually consists of nine bits, each being "0" or "1", the most significant bit being the 8th bit, the second most significant bit being the 7th bit; the same rule applies for the remaining bits, with the least significant bit being the 0th bit. If the value of a bit in the CodRange value to be updated is 1 and all the upper bits preceding it are 0's, mark this bit as the mth bit, remove all the upper bits preceding the mth bit, put the mth bit and all the succeeding bits in turn into the starting position of the most significant bit, and assign zero to all the vacant lower bits. The CodRange value thus obtained is the updated CodRange value. For example, the value of a CodRange is 0001xxxxx, to update it, remove "0" from the 8th, 7th, and 6th bits, and use the succeeding "1xxxxx" as the 8th-3rd bits of the updated CodRange, and fill "0" into the vacant 2th-0th bits. The updated CodRange value is thus obtained: 1xxxxx000, which will be used for next renormalization. In general, the number of all the upper bits preceding the mth bit may be 0, 1, 2, 3, 4, 5, 6, or 7.

Update of the CodRange value through hardware circuit implementation can be completed within one clock cycle.

While updating the CodRange value, the CodRange analysis module also outputs the number of valid bits, which indicates the bit number of valid output characters in the 7-bit output string acquired according to the updated CodLow value. The number of valid output characters determined by a CodLow value to be updated equals the number of the upper bits removed when CodRange is updated; that is, the bit number of the valid output characters in the 7-bit output string equals the number of the upper bits removed when CodRange is updated. For example, if the number of the upper bits removed from a CodRange value during its update is 3, the number of valid output characters determined by the current CodLow value to be updated is 3, comprising the ones determined by the 9th bit and the 8th bit, the 8th bit and the 7th bit, and the 7th bit and the 6th bit.

The maximum number of valid output characters determined by a CodLow value to be updated is 7; in terms of binary representation, a 3-bit number may be used to indicate a certain number between 0 and 7 as the number of valid bits.

The output character extracting cache module is adapted to extract valid output characters from the 7-bit output string according to the number of valid bits, store the extracted output characters, and identify the output characters in undetermined state among the extracted valid output characters according to the 7-bit ID string.

The undetermined state identification and packet output module is adapted to read output characters from the output character extracting cache module, process the read output characters, acquire the coding output bytes, and output the coding output bytes.

That is to say, the undetermined state identification and packet output module reads and judges the output characters received from the output character extracting cache module. If it judges a currently-read output character to not be in undetermined state, it enters this output character into the current coding output byte; then it judges if the counter counting characters in undetermined state is zero, if the counter is zero, it continues to read the next output character; otherwise it inserts the number (say k) of characters in undetermined state which is opposite to the currently-read output character, i.e, if the currently-read character is 1, output k 0's; if the currently-read character is 0, output k 1's. If the module judges the currently-read output character is in undetermined state, it adds 1 to the count of the number of output characters in undetermined state.

At the same time, the number of output characters in undetermined state is reset for integrated counting next time.

Current coding output bytes refer to the bytes being coded currently and to be output. When the 8-bit output characters of a coding output byte are all filled up, this coding output byte shall be output. The 8-bit output characters of the coding output byte are arranged from the highest order to the lowest order according to the priority of extracted output characters.

Optionally, the output character extracting cache module comprises an FIFO (First-in First-out) cache module, an output string conversion module and an output character FIFO cache module.

Figure 6:
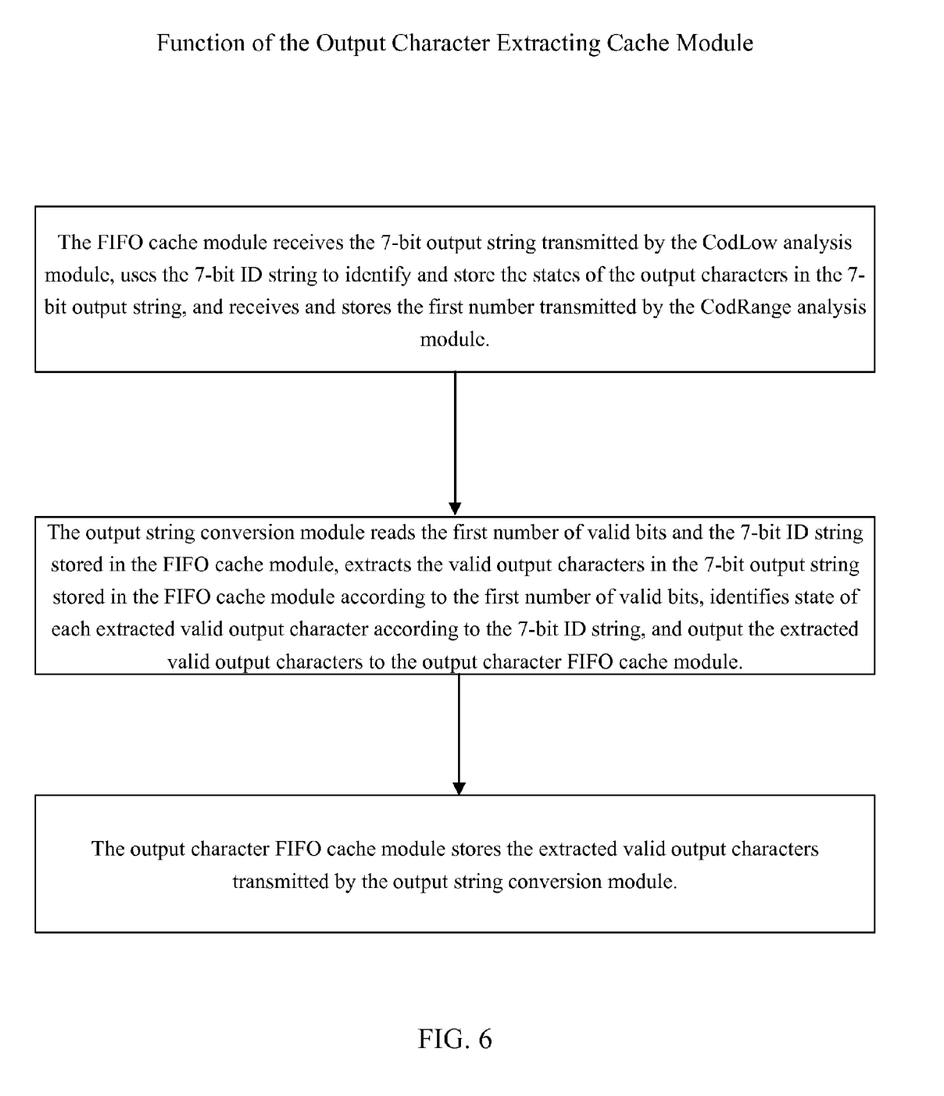
FIG. 6 shows function of the output character extracting cache module according to one embodiment of the present invention.

As shown in FIG. 6, an FIFO cache module is adapted to receive the 7-bit output string transmitted by the CodLow analysis module, use the 7-bit ID string to identify and store the output characters in undetermined state in the 7-bit output string, and receive and store the number of valid bits transmitted by the CodRange analysis module.

An output string conversion module, adapted to read the number of valid bits and the 7-bit ID string stored in the FIFO cache module, extract the valid output characters in the 7-bit output string stored in the FIFO cache module according to the number of valid bits, identify the output characters in undetermined state among the extracted valid output characters according to the 7-bit ID string, and output the extracted valid output strings to the output character FIFO cache module.

When the output string conversion module outputs the extracted 7-bit output string to the output character FIFO cache module, each output character may adopt binary representation; more specifically, "00" is used to indicate "0"; "01" is used to indicate "1"; and "10" is used to indicate characters in undetermined state; and the foregoing output character FIFO cache module, adapted to store the output characters transmitted by the output string conversion module.

Figure 2B:
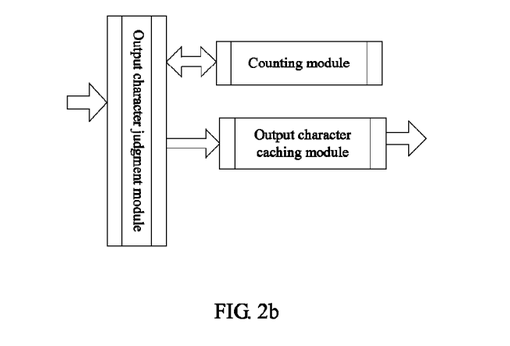
FIG. 2b shows a structure of the undetermined state identification and packet output module shown in FIG. 2a according to one embodiment of the present invention.

Optionally, the undetermined state identification and packet output module comprises an output character judgment module, a counting module and an output character caching module, with its structure as shown in FIG. 2*b*.

Figure 7:
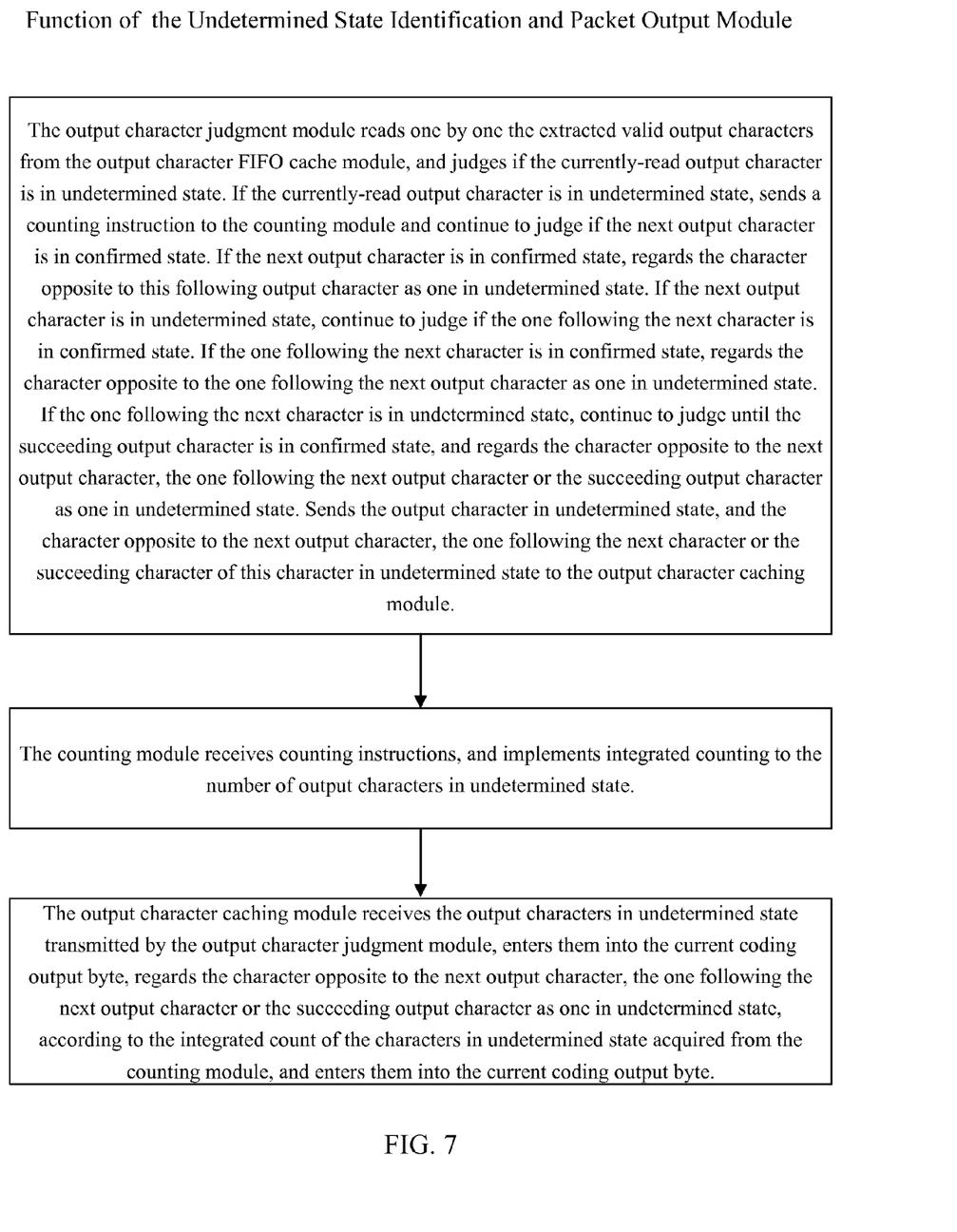
FIG. 7 shows function of the undetermined state identification and packet output module according to one embodiment of the present invention.

As shown in FIG. 7, an output character judgment module is adapted to read one by one the output characters in the output string from the output character FIFO cache module, and judge if the currently-read output character is in undetermined state; if yes, it sends a counting instruction to the counting module; if no, it judges if the number of output characters in undetermined state stored in the counting module is 0; if the number is 0, it sends the currently-read output character to the output character caching module; if the number is not 0, it sends the currently-read output character together with the number of output characters in undetermined state acquired from the counting module to the output character caching module, and reset the number of output characters in undetermined state.

That is to say, the output character judgment module is adapted to read one by one the output characters in the output string from the output character FIFO cache module, and judge if the currently-read output character is in undetermined state; if yes, it sends a counting instruction to the counting module and continue to judge if the next output character is in confirmed state; if yes, it regards the character opposite to this following output character as one in undetermined state; otherwise, it continues to judge if the one following the next character is in confirmed state; if yes, it regards the character opposite to the one following the next output character as one in undetermined state; otherwise, it continues to judge until the succeeding output character is in confirmed state, and regards the character opposite to the next output character, the one following the next output character or the succeeding output character as one in undetermined state; next, it sends the output character in undetermined state, and the character opposite to the next output character, the one following the next character or the succeeding character of this one in undetermined state to the output character caching module A counting module, adapted to receive counting instructions, and implement integrated counting to the number of output characters in undetermined state.

An output character caching module, adapted to receive the output characters in undetermined state transmitted by the output character judgment module, enter them into the related positions of the current coding output byte, regard the character opposite to the one following this output character in undetermined state as one in undetermined state, enter it in the number of output characters in undetermined state and the output character opposite to the currently-read one according to the integrated count acquired from the counting module.

Figure 3:
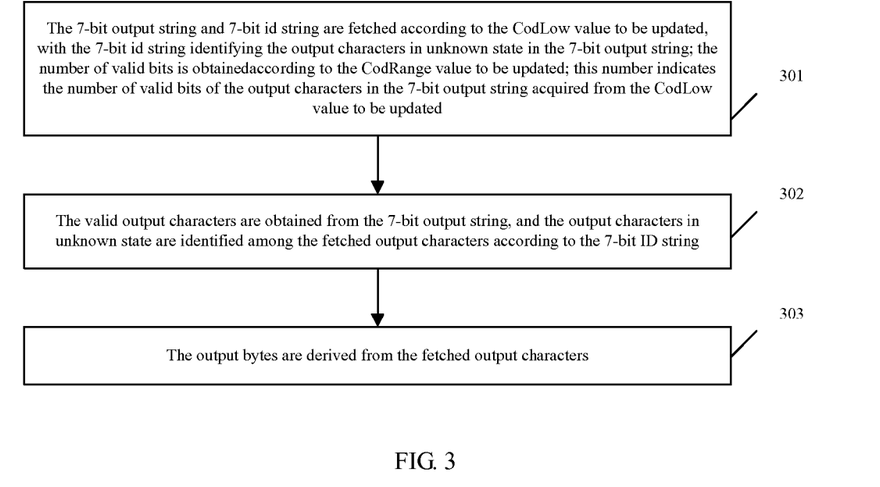
FIG. 3 is a flowchart of the method of arithmetic code package outputting according to one embodiment of the present invention.

FIG. 3 is a flowchart of the method of renormalization and package outputting for arithmetic codes as embodied in the present invention. The method comprises:

In Step 301, acquire the 7-bit output string and 7-bit ID string according to the CodLow value to be updated, with the 7-bit ID string identifying the output characters in undetermined state in the 7-bit output string; acquire the number of valid bits according to the CodRange value to be updated; this number indicates the number of valid bits of the output characters in the 7-bit output string acquired from the updated CodLow value.

In Step 302, extract the valid output characters in the 7-digt output string, and identify the output characters in undetermined state among the extracted ones according to the 7-bit ID string; and In Step 303, process the extracted output characters, acquire and output the coding output bytes.

This step further comprises: judging the extract output characters one by one, if the current output character is judged to be in undetermined state, continuing to read the next one, and judging if the number of the next output character is 0; if yes, confirming the output character in undetermined state as the one opposite to the output character following the judged one, i.e, confirming the output character in undetermined state as 1; if the number is not 0, confirming the output character in undetermined state as 0; and entering the confirmed 1 or 0 into the current coding output byte;

Likewise, if the next output character is read and judged to be in undetermined state, implement integrated counting to the number of the characters in undetermined state, and continue to read the one following the next output character; judge if the number of the output character following the next one is 0; if yes, confirm all the output characters in undetermined state to be 1; if the number is not 0, confirm all the output characters in undetermined state to be 0; enter the confirmed 1 or 0 into the current coding output byte, and reset the number of output characters in undetermined state, and implement integrated counting to such characters for the next time. When the 8-bit output characters of a coding output byte are all filled up, output this coding output byte.

Optionally, prior to step 301, this method comprises: acquiring the updated CodLow value through hardware circuit implementation according to the CodLow value and the CodRange value to be updated; and acquiring the updated CodRange value through hardware circuit implementation according to the CodRange value to be updated.

The method of software implementation through serial processing in the prior art is mixed with the update of the CodRange value and the CodLow value, and CPU cannot simultaneously satisfy all the conditions for updating the CodRange value and the CodLow value; thereby, a maximum of seven loops are required. In the embodiment of the present invention, the parallel processing method is adopted to acquire the CodRange value and the CodLow value to be updated, with the update of CodRange and CodLow separately processed; simultaneously, the number of valid bits, the 7-bit output string and the 7-bit ID string are obtained; according to the three, the output characters are acquired. It takes only two clock cycles to complete renormalization and package outputting with the method as embodied in the present invention, comprising the first clock cycle in which to complete updating and acquire the number of valid bits, the 7-bit string and the 7-bit ID string; and the second clock cycle in which to acquire the output characters according to the number of valid bits, the 7-bit string and the 7-bit ID string.

Separation of renormalization from package outputting and separation of CodRange update from CodLow update provide the possibility for arithmetic coding in hardware circuits and complete the renormalization process involving any number of loops within two clock cycles, thereby simplifying the renormalization and package outputting process and speeding up coding.

It is understandable to those skilled in the art that all or part of the procedures in the foregoing embodiments may be performed through hardware instructed by a program. The program may be stored in a computer-readable storage medium. When being executed, the program performs these procedures in the foregoing embodiments. The storage medium can be a magnetic disk, compact disk, read-only memory (ROM) or random access memory (RAM).

The foregoing embodiments further detail the object, technical scheme and beneficial effects of the present invention. It should be understood that although the invention is described through some exemplary embodiments, the invention is not limited to such embodiments. It is apparent that without departing from the spirit and scope of the invention, any modifications, replacements or improvements regarding the invention shall fall in the scope of protection defined by the following claims or their equivalents.

The invention claimed is:

1. A method of arithmetic code package outputting, comprising:
    acquiring a 7-bit output string according to upper bits of a CodLow value, wherein each bit of the 7-bit output string defines an output character, and the CodLow value is a starting position of a probability space to be updated;
    generating a 7-bit ID string to identify states of the output characters of the 7-bit output string, wherein each state is a confirmed state or an undetermined state;
    acquiring a first number according to a CodRange value, wherein the CodRange value is a length of the probability space to be updated;
    extracting the first number of output characters from the 7-bit output string to form valid output characters,
    identifying the state of each valid output character according to the 7-bit ID string; and
    processing the valid output characters according to the states of the valid output characters to obtain coding output bytes, and outputting the coding output bytes,
    wherein the output characters adopt binary representation, with "00" indicating "0", "10" and "11" indicating "1", and "01" indicating characters in undetermined state.

2. The method according to claim 1, further comprising acquiring an updated CodLow value according to the CodLow value and the CodRange value.

3. The method according to claim 2, wherein the acquiring the updated CodLow value comprises:
    counting a second number of bits valued "0" starting from the most significant bit to the first bit valued "1" of the CodRange value;
    if all the second number of the upper bits of the CodLow value are 1's left shifting the CodLow value by the second number of bits and filling "0" in the lower bits; and
    if at least one of the second number of upper bits of the CodLow value is 0, left shifting the CodLow value by the second number of bits, filling "0" in the lower bits and setting the most significant bit as "0".

4. The method according to claim 1, further comprising acquiring an updated CodRange value according to the CodRange value.

5. The method according to claim 4, wherein the acquiring the updated CodRange value comprises:
    counting a third number of bits valued "0" starting from the most significant bit to the first bit valued "1" of the CodRange value; and
    left shifting the CodRange value by the third number of bits and filling "0" in the lower bits.

6. A device for arithmetic code package outputting, comprising
    a CodLow analysis module;
    a CodRange analysis module;
    an output character extracting cache module; and
    an undetermined state identification and packet output module,
    wherein the CodLow analysis module is adapted to acquire a 7-bit output string according to upper bits of a CodLow value to be updated, each bit of the 7-bit output string defining an output character, generate a 7-bit ID string to identify states of the output characters in the 7-bit output string, each state being a confirmed state or an undetermined state, and transfer the 7-bit output string to the output character extracting cache module;
    wherein the CodRange analysis module is adapted to acquire a first number according to a CodRange value to be updated, and transfer the first number to the output character extracting cache module;
    wherein the output character extracting cache module is adapted to extract the first number of output characters from the 7-bit output string to form valid output characters, store the extracted valid output characters, and identify the state of each valid output character according to the 7-bit ID string;
    wherein the undetermined state identification and packet output module is adapted to read the valid output characters from the output character extracting cache module, process the read valid output characters according to the states of the valid output characters to obtain coding output bytes, and output the coding output bytes; and wherein the output characters adopt binary representation, with "00" indicating "0", "10" and "11" indicating "1", and "01" indicating characters in undetermined state.

7. The device according to claim 6, wherein the output character extracting cache module comprises an FIFO cache module, an output string conversion module, and an output character FIFO cache module;

wherein the FIFO cache module is adapted to receive the 7-bit output string transmitted by the CodLow analysis module, use the 7-bit ID string to identify and store the states of the output characters in the 7-bit output string, and receive and store the first number transmitted by the CodRange analysis module;

wherein the output string conversion module is adapted to read the first number and the 7-bit ID string stored in the FIFO cache module, extract the valid output characters in the 7-bit output string stored in the FIFO cache module according to the first number, identify state of each extracted valid output character according to the 7-bit ID string, and output the extracted valid output characters to the output character FIFO cache module; and wherein the output character FIFO cache module is adapted to store the extracted valid output characters transmitted by the output string conversion module.

8. The device according to claim 7, wherein the undetermined state identification and packet output module comprises an output character judgment module, a counting module, and an output character caching module;

wherein the output character judgment module is adapted to read one by one the extracted valid output characters from the output character FIFO cache module, and judge if the currently-read output character is in undetermined state; if the currently-read output character is in undetermined state, send a counting instruction to the counting module and continue to judge if the next output character is in confirmed state; if the next output character is in confirmed state, regard the character opposite to this following output character as one in undetermined state; if the next output character is in undetermined state, continue to judge if the one following the next character is in confirmed state; if the one following the next character is in confirmed state, regard the character opposite to the one following the next output character as one in undetermined state; if the one following the next character is in undetermined state, continue to judge until the succeeding output character is in confirmed state, and regard the character opposite to the next output character, the one following the next output character or the succeeding output character as one in undetermined state; send the output character in undetermined state, and the character opposite to the next output character, the one following the next character or the succeeding character of this character in undetermined state to the output character caching module;

wherein the counting module is adapted to receive counting instructions, and implement integrated counting to the number of output characters in undetermined state; and wherein the output character caching module is adapted to receive the output characters in undetermined state transmitted by the output character judgment module, enter them into the current coding output byte, regard the character opposite to the next output character, the one following the next output character or the succeeding output character as one in undetermined state, according to the integrated count of the characters in undetermined state acquired from the counting module, and enter them into the current coding output byte.

9. The device according to claim 6, wherein the CodLow analysis module acquires an updated CodLow value according to the CodLow value to be updated and the CodRange value to be updated.

10. The device according to claim 9, wherein the CodLow analysis module acquires the updated CodLow value by:

counting a second number of bits valued "0" starting from the most significant bit to the first bit valued "1" of the CodRange value to be updated;

if all the second number of the upper bits of the CodLow value to be updated are 1's left shifting the CodLow value to be updated by the second number of bits and filling "0" in the lower bits to acquire the updated CodLow value; and if at least one of the second number of the upper bits of the CodLow value is 0, left shifting the CodLow value to be updated by the second number of bits, filling "0" in the lower bits, and setting the most significant bit as "0" to acquire the updated CodLow value.

11. The device according to claim 6, wherein the CodRange analysis module acquires an updated CodRange value according to the CodRange value to be updated.

12. The device according to claim 11, wherein the CodRange analysis module acquires the updated CodRange value by:

counting a third number of bits valued "0" starting from the most significant bit to the first bit valued "1" of the CodRange value to be updated;

left shifting the CodRange value to be updated by the third number of bits and filling "0" in the lower bits to acquire the updated CodRange value.

* * * * *